United States Patent
Hwang et al.

(10) Patent No.: US 8,297,293 B2
(45) Date of Patent: Oct. 30, 2012

(54) SUBSTRATE SUPPORT UNIT, AND SUBSTRATE TREATING APPARATUS AND METHOD USING THE SAME

(75) Inventors: Dong-Soon Hwang, Chungcheongnam-do (KR); Tae-In Kim, Gyeonggi-do (KR); Sung-Jin Hong, Chungcheongnam-do (KR)

(73) Assignee: Semes Co. Ltd, Chungcheongnam-Do (KR)

( * ) Notice: Subject to any disclaimer, the term of this patent is extended or adjusted under 35 U.S.C. 154(b) by 321 days.

(21) Appl. No.: 12/284,800

(22) Filed: Sep. 25, 2008

(65) Prior Publication Data

US 2009/0095327 A1    Apr. 16, 2009

(30) Foreign Application Priority Data

Oct. 10, 2007    (KR) .......................... 10-2007-0101879
Oct. 10, 2007    (KR) .......................... 10-2007-0101880

(51) Int. Cl.
    *B08B 3/02*    (2006.01)
(52) U.S. Cl. ........................... 134/137; 134/66; 134/151
(58) Field of Classification Search .................. 134/902, 134/32, 33, 66, 137, 151; 414/935, 941
    See application file for complete search history.

(56) References Cited

U.S. PATENT DOCUMENTS

| | | | |
|---|---|---|---|
| 5,504,345 A | | 4/1996 | Bartunek et al. |
| 6,068,002 A | * | 5/2000 | Kamikawa et al. ............. 134/66 |
| 2003/0159713 A1 | * | 8/2003 | Park et al. ........................ 134/2 |
| 2004/0012363 A1 | * | 1/2004 | Simondet ................ 318/568.21 |
| 2009/0095327 A1 | | 4/2009 | Hwang et al. |

FOREIGN PATENT DOCUMENTS

| | | |
|---|---|---|
| JP | 2003297794 A | 10/2003 |
| JP | 2005064501 A * | 3/2005 |
| JP | 2006324495 A | 11/2006 |
| KR | 10-2004-0008059 | 1/2004 |
| KR | 10-2005-0019456 | 3/2005 |
| KR | 10-0564622 | 3/2006 |

* cited by examiner

*Primary Examiner* — Michael Barr
*Assistant Examiner* — Douglas Lee
(74) *Attorney, Agent, or Firm* — Jenkins, Wilson, Taylor & Hunt, P.A.

(57) ABSTRACT

Provided are a substrate support unit and a substrate treating apparatus and method using the same. The substrate support unit includes a first support part and a second support part. The first support part is movable in a first direction. The first support part supports a first portion of a substrate in which a processing fluid is supplied in a direction corresponding to the first direction. The second support part is movable in a second direction. The second support part supports a second portion of the substrate. At least one of the first support part and the second support part supports the substrate while the processing fluid is supplied.

10 Claims, 16 Drawing Sheets

SUBSTRATE SUPPORT UNIT, AND SUBSTRATE TREATING APPARATUS AND METHOD USING THE SAME

CROSS-REFERENCE TO RELATED APPLICATIONS

This U.S. non-provisional patent application claims priority under 35 U.S.C. §119 to Korean Patent Application No. 10-2007-0101879, filed on Oct. 10, 2007 and Korean Patent Application No. 10-2007-0101880, filed on Oct. 10, 2007, the entire contents of which are hereby incorporated by reference.

BACKGROUND OF THE INVENTION

The present invention disclosed herein relates to a substrate support unit and a substrate treating apparatus and method using the same, and more particularly, to a substrate supporting unit that supports a semiconductor substrate so that a process is uniformly performed on an entire region of the semiconductor substrate, and a substrate treating apparatus and method using the substrate supporting unit.

An electronic device such as a semiconductor memory device or a flat display device includes a substrate. The substrate may include a silicon wafer or a glass substrate. A plurality of conductive layer patterns is disposed on the substrate, and insulation layer patterns are disposed between the conductive layer patterns different from each other. The conductive layer patterns or the insulation layer patterns are formed through a series of processes such as exposure, development, and etching processes.

A precision of the processes is important because the conductive layer patterns and the insulation layer patterns have sizes ranging from several micrometers to several nanometers. That is, a process must be uniformly performed with respect to all substrates. If the process is non-uniformly performed, errors occur in the patterns to cause a malfunction of the electronic device.

For example, in case where the process is a cleaning process with respect to the substrate, target substrates are dipped in a treating solution within a chamber. The cleaning process is progressed while the target substrates react with the treating solution. After the cleaning process is performed, the substrates are dried. When the cleaning process is non-uniformly performed with respect to the substrates, watermarks occur in a predetermined region to cause impurity particles. As a result, the malfunction of the electronic device using the substrate is caused by the impurity particles.

SUMMARY OF THE INVENTION

The present invention provides a substrate support unit that supports a semiconductor substrate so that a process is uniformly performed on an entire region of the semiconductor substrates.

The present invention also provides a substrate treating apparatus using a substrate support unit.

The present invention also provides a substrate treating method using a substrate support unit.

Embodiments of the present invention provide substrate support units including a first support part and a second support part. The first support part is movable in a first direction and supports a first portion of a substrate in which a processing fluid is supplied in a direction corresponding to the first direction. The second support part is movable in a second direction and supports a second portion of the substrate. At least one of the first support part and the second support part supports the substrate while the processing fluid is supplied.

In other embodiments of the present invention, substrate support units include a first support part and a second support part. The first support part is movable in a vertical direction and supports a lower end of a substrate that is vertically disposed. The second support parts are movable in a horizontal direction and support both side ends of the substrate.

In still other embodiments of the present invention, substrate treating apparatuses include a chamber, a sprayer, and a substrate support unit. The first chamber receives a substrate and performs a process with respect to the substrate. The sprayer is disposed in the first chamber and supplies a processing fluid to the substrate. The substrate support unit is disposed in the first chamber and supports the substrate while the process is progressed.

The substrate support unit includes a first support part and a second support part. The first support part is movable in a first direction corresponding to a direction in which the processing fluid is supplied. The first support part supports a first portion of the substrate. The second support part is movable in a second direction and supports a second portion of the substrate. At least one of the first support part and the second support part supports the substrate while the processing fluid is supplied.

In even other embodiments of the present invention, substrate treating apparatuses include a first chamber, a second chamber, a first support, and a second support. The first chamber receives a substrate and performs a first process with respect to the substrate. The second chamber is connected to the first chamber and performs a second process with respect to the substrate. The first support supports the substrate and is transferred together with the substrate between the first chamber and the second chamber. The second support supports the substrate in the second chamber and is rotatable with the substrate supported thereon.

In yet other embodiments of the present invention, substrate treating methods include: supporting a substrate with a first support in a first chamber and performing a first process with respect to the substrate; transferring the first support supporting the substrate to a second chamber connected to the first chamber; spacing the first support from the substrate and supporting the substrate with a second support; and performing a second process with respect to the substrate while the second support rotates.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
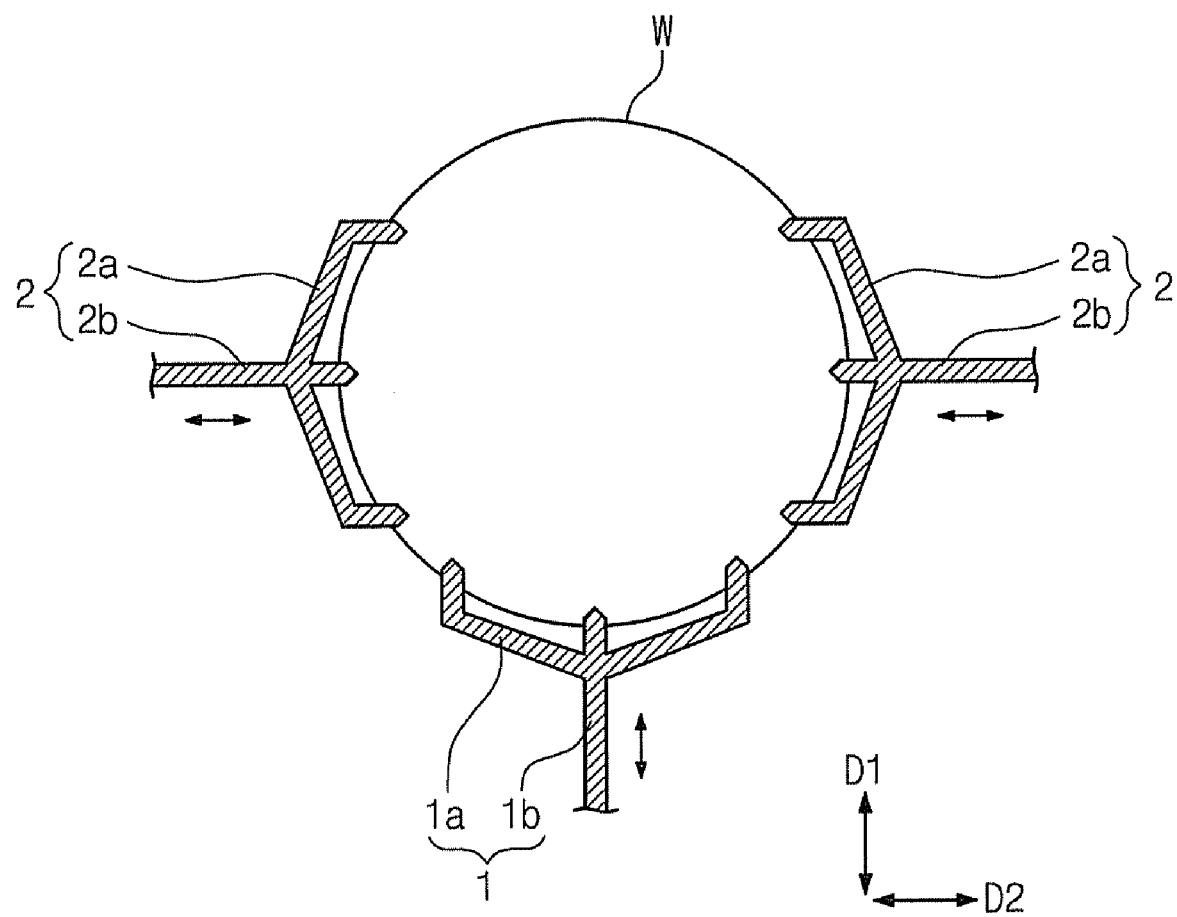
FIG. 1 is a cross-sectional view of a substrate support unit according to an embodiment of the present invention.

FIG. 1 is a cross-sectional view of a substrate support unit according to an embodiment of the present invention.

Referring to FIG. 1, a substrate support unit includes a first support part 1 supporting a wafer W and second support parts 2. The first support part 1 is moved in a first direction D1 and supports a lower end of the wafer W. The second support parts 2 are moved in a second direction D2 perpendicular to the first direction D1 and support both side ends of the wafer W. A pair of second support parts 2 facing each other is provided.

Since the wafer W is placed in the first direction D1, the wafer W can be stably supported even if the wafer W is supported in only one direction with respect to the first direction D1. On the other hand, the wafer W must be supported at both sides with respect to the second direction D2 in order to stably support the wafer W. Thus, it is preferable that the first support part is provided in singularity, and the second support parts are provided in plurality. For securing more stable support, the first support part 1 may be provided in plurality. Also, if the wafer W can be stably supported by supporting only one side thereof, the second support parts 2 may be provided in singularity. In this embodiment, it is important to provide a plurality of supports that supports the wafer W at different positions regardless of numbers of the first and second support parts 1 and 2.

The first support part 1 includes a first support 1a and a first driver 1b. The first support 1a is in contact with the wafer W to substantially support the wafer W. The first driver 1b generates and transmits a power required for moving the first support 1a in the first direction D1. The second support part 2 includes a second support 2a and a second driver 2b. The second support 2a supports the wafer W. The second driver 2b generates and transmits a power required for moving the second support 2a in the second direction D2.

Figure 2:
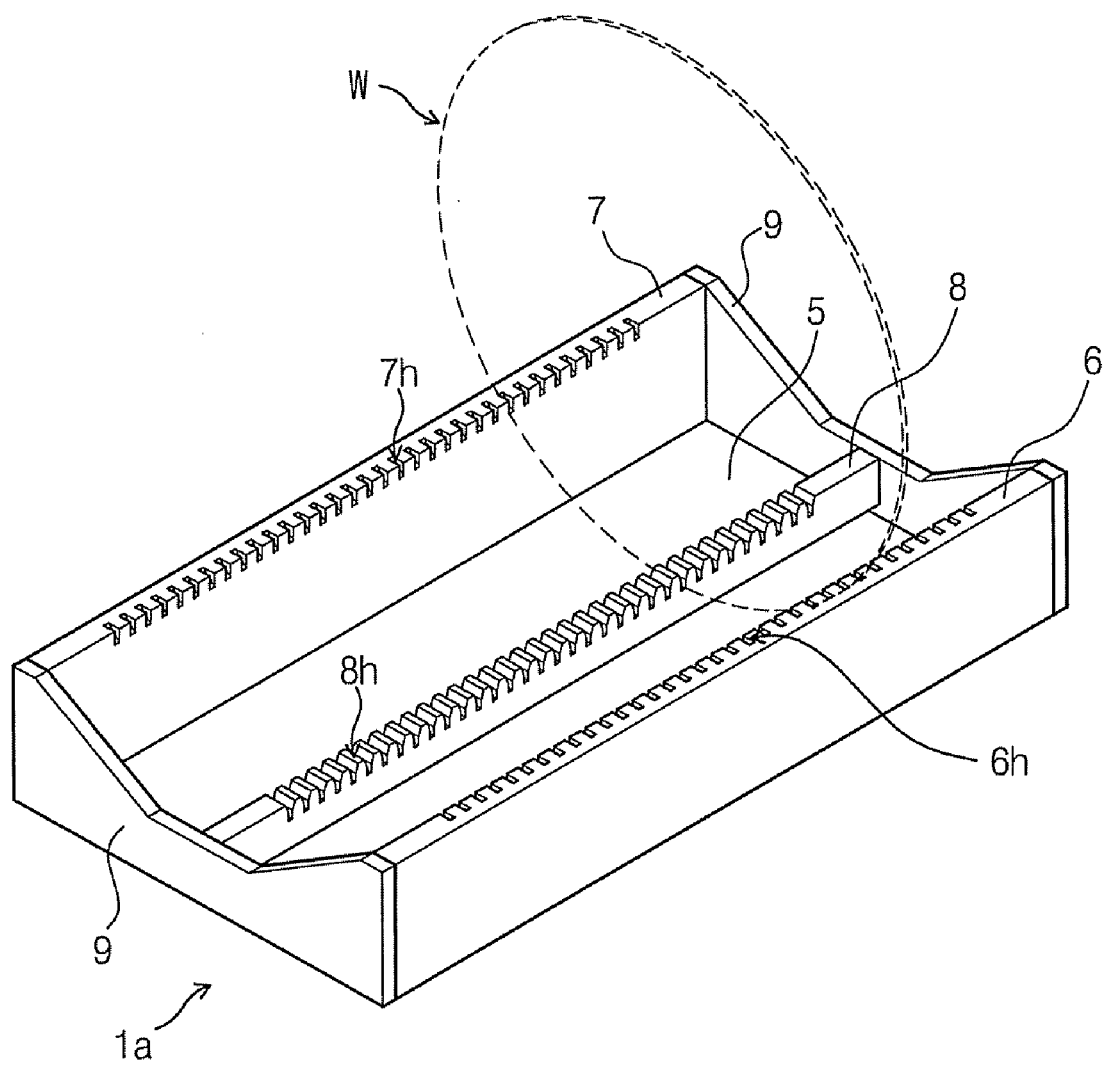
FIG. 2 is a perspective view of a first support illustrated in FIG. 1.

FIG. 2 is a perspective view of the first support 1a illustrated in FIG. 1.

Referring to FIG. 2, the first support 1a includes a base plate 5, first through third support members 6, 7, and 8, and a connecting plate 9. The first through third support members 6, 7, and 8 are spaced from one another, and are perpendicular to the base plate 5. The connecting plate 9 connects the first through third support members 6, 7, and 8 spaced from one another to each other. A pair of connecting plates 9 is provided at front and rear sides of the first support 1a.

Slots having a groove shape 6h, 7h, and 8h are disposed in the first through third support members 6, 7, and 8, respectively. The slots 6h, 7h, and 8h are provided in plurality along a longitudinal direction of the first through third support members 6, 7, and 8. The first support 1a can support a plurality of wafers W corresponding to the number of slots 6h, 7h, and 8h at a time. For example, the first support 1a can support fifty wafers at a time, and each wafer W is supported at three positions by the first through third support members 6, 7, and 8.

The first and second support members 6 and 7 are disposed at edge portions of the base plate 5. The third support member 8 is disposed between the first and second support members 6 and 7. Heights of the first and second support members 6 and 7 are higher than that of the third support member 8. As a result, the third support member 8 supports a lower surface of the wafer W, and the first and second support members 6 and 7 support portions moved from the lower surface toward a side surface.

A structure of the first support 1a is exemplary one. The first support 1a may have various structures supporting the wafer W. The second support 2a may have the same or similar structure as the first support 1a.

Figure 3A:
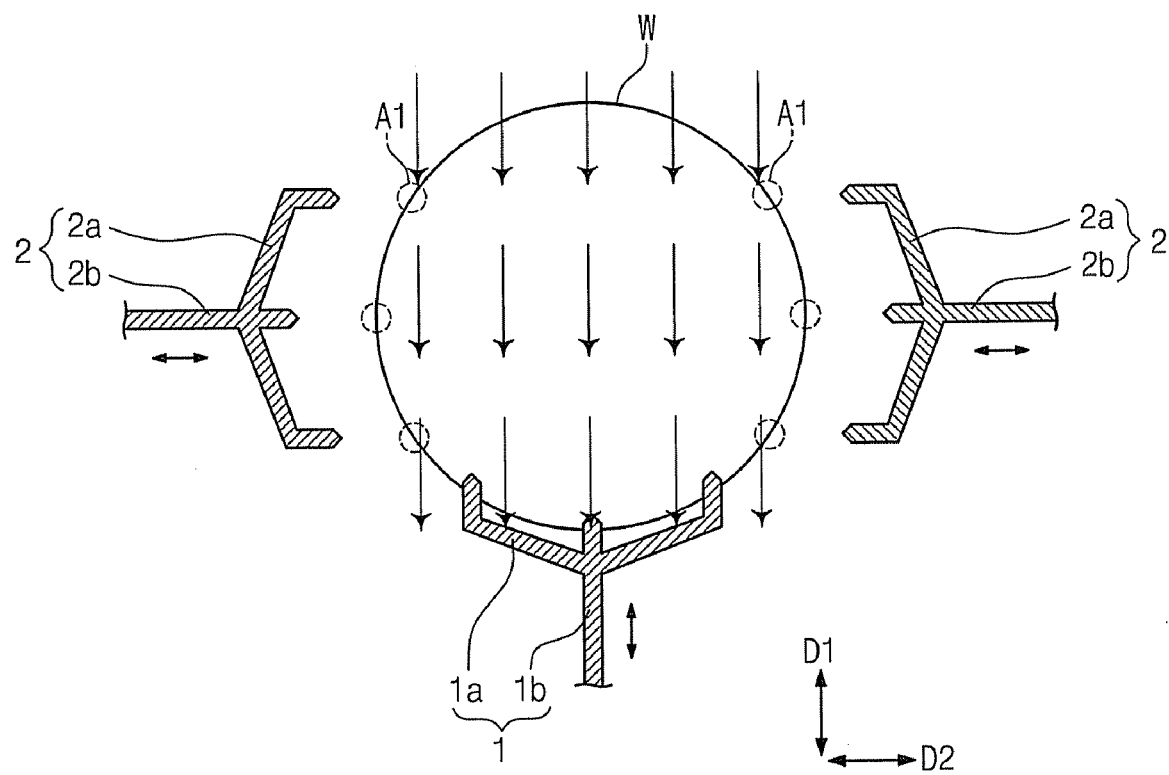
FIGS. 3A and 3B are cross-sectional views explaining effects of the substrate support unit illustrated in FIG. 1.
Figure 3B:
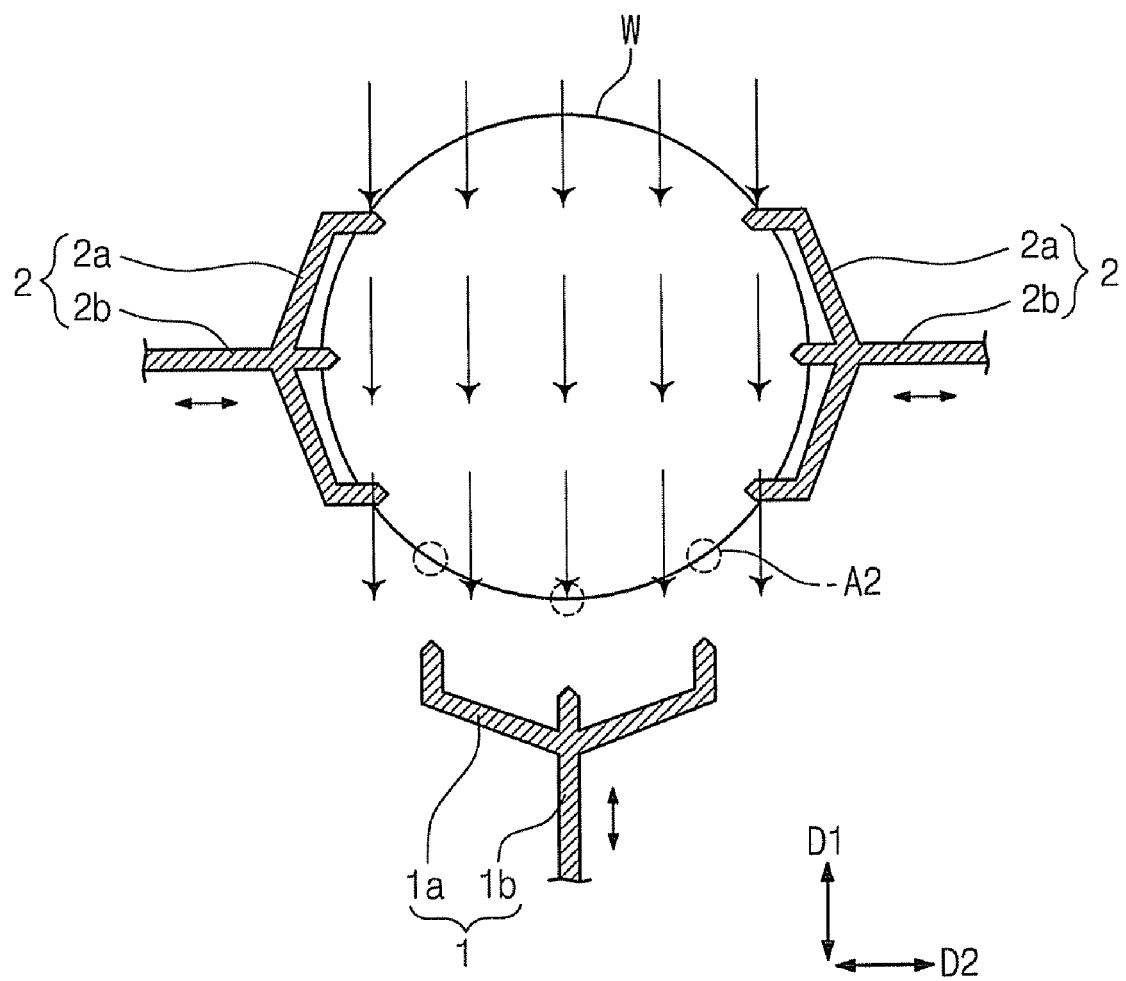

FIGS. 3A and 3B are cross-sectional views explaining effects of the substrate support unit illustrated in FIG. 1.

Referring to FIG. 3A, a process is performed while the wafer W is loaded onto the first support part 1. During the process, a processing fluid is sprayed in the first direction D1 (indicated with arrows), and the processing fluid reacts with the wafer W. In this type of the process, firstly, the processing fluid must reach in a corresponding region of the wafer W in order to perform the process on an entire region of the wafer W.

During the process, the second support part 2 is spaced from the wafer W. The processing fluid reaches in an entire region of the wafer except a region in which the first support part 1 supports the wafer W. Thus, the processing fluid also reaches in a region A1 supported by the second support part 2.

Referring to FIG. 3B, after the passing of time, the first support part 1 is spaced from the wafer W, and the wafer W is supported by the second support part 2. During the process, the processing fluid reaches in an entire region of the wafer except the region in which the second support part 2 supports the wafer W. Thus, the processing fluid also reaches in the region A2 supported by the first support part 1 on the wafer W.

Since the first and second support parts 1 and 2 supporting different regions on the wafer W are provided and support the wafer W at different times, the processing fluid reaches in the entire region of the wafer W. As a result, the process is uniformly performed on the entire region of the wafer W to prevent processing defects.

A substrate treating apparatus and a substrate treating method using the substrate support unit will now be described.

Figure 4:
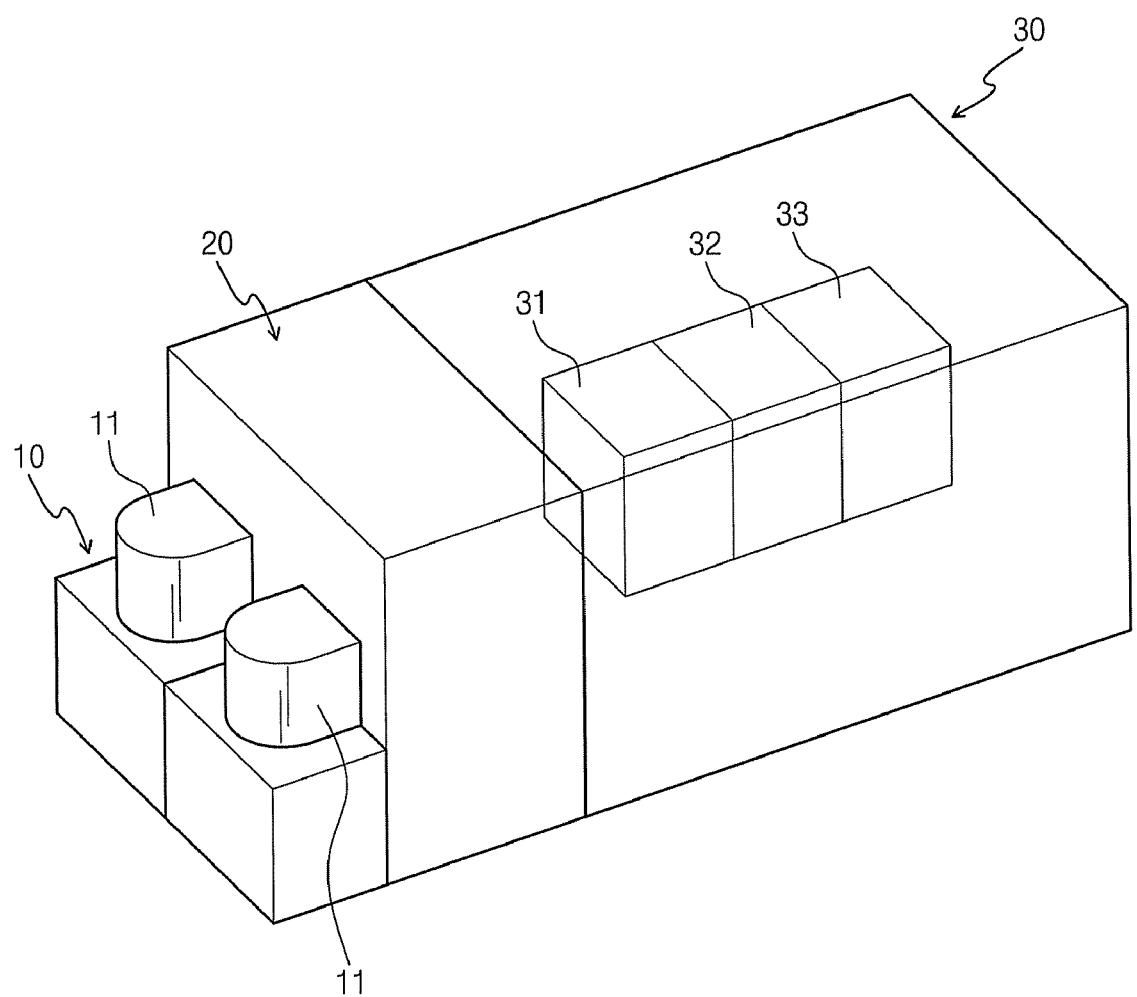
FIG. 4 is a perspective view of a substrate treating apparatus according to an embodiment of the present invention.

FIG. 4 is a perspective view of a substrate treating apparatus according to an embodiment of the present invention.

Referring to FIG. 4, a substrate treating apparatus includes a lord port 10, a transfer unit 20, and a treating unit 30. A wafer is loaded/unloaded into/from the load port 10. A plurality of wafers is treated at a time using a cassette 11 in the load port 10. One cassette 11 can receive a maximum of twenty-five wafers. Thus, a maximum of fifty wafers can be treated at a time using two cassettes 11.

The transfer unit 20 receives the wafer from the load port 10 to transfer the wafer to the treating unit 30. A transfer robot (not shown) transferring the wafer is disposed in a lower portion of the transfer unit 20.

The treating unit 30 treats the wafer transferred from the transfer unit 20. The treating unit 30 includes a plurality of sub-treating units. That is, the treating unit 30 includes a first sub-treating unit 31, a second sub-treating unit 32, and a third sub-treating unit 33. If necessary, the treating unit 30 may further include an additional sub-treating unit in addition to the first through third sub-treating units 31, 32, and 33. On the other hand, a portion of the first through third sub-treating units 31, 32, and 33 may be, if necessary, omitted in the treating unit 30.

Each of the first through third sub-treating units 31, 32, and 33 includes a treating bath containing a processing solution in order to perform various processes with respect to the wafer. For example, the processes may include etching, cleaning, and drying processes. During the etching, cleaning, and drying processes, HF, $H_2SO_4$, deionized water, $C_3H_8O$, $N_2$, and so on may be variously used as the processing solution or a processing gas.

The processing solution contained in the treating bath of each of the first through third sub-treating units 31, 32, and 33 may be the same processing solution in order to perform the same process. The processing solution contained in the treating bath of each of the first through third sub-treating units 31, 32, and 33 may be a processing solution having components different from each other with respect to the same process. The processing solution contained in the treating bath of each of the first through third sub-treating units 31, 32, and 33 may be a processing solution different from each other in order to perform a different process.

Figure 5:
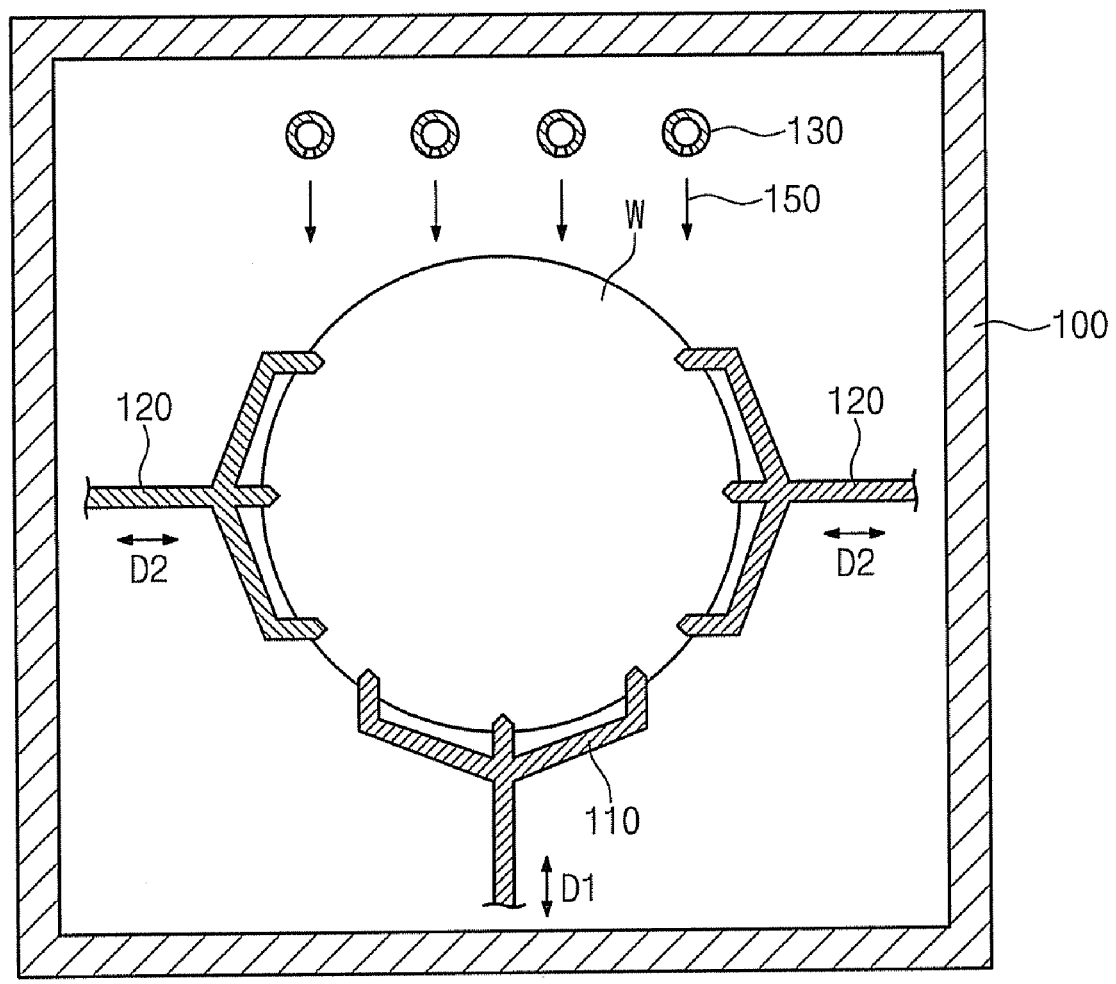
FIG. 5 is a cross-sectional view of a sub-treating unit illustrated in FIG. 4.
Figure 6:
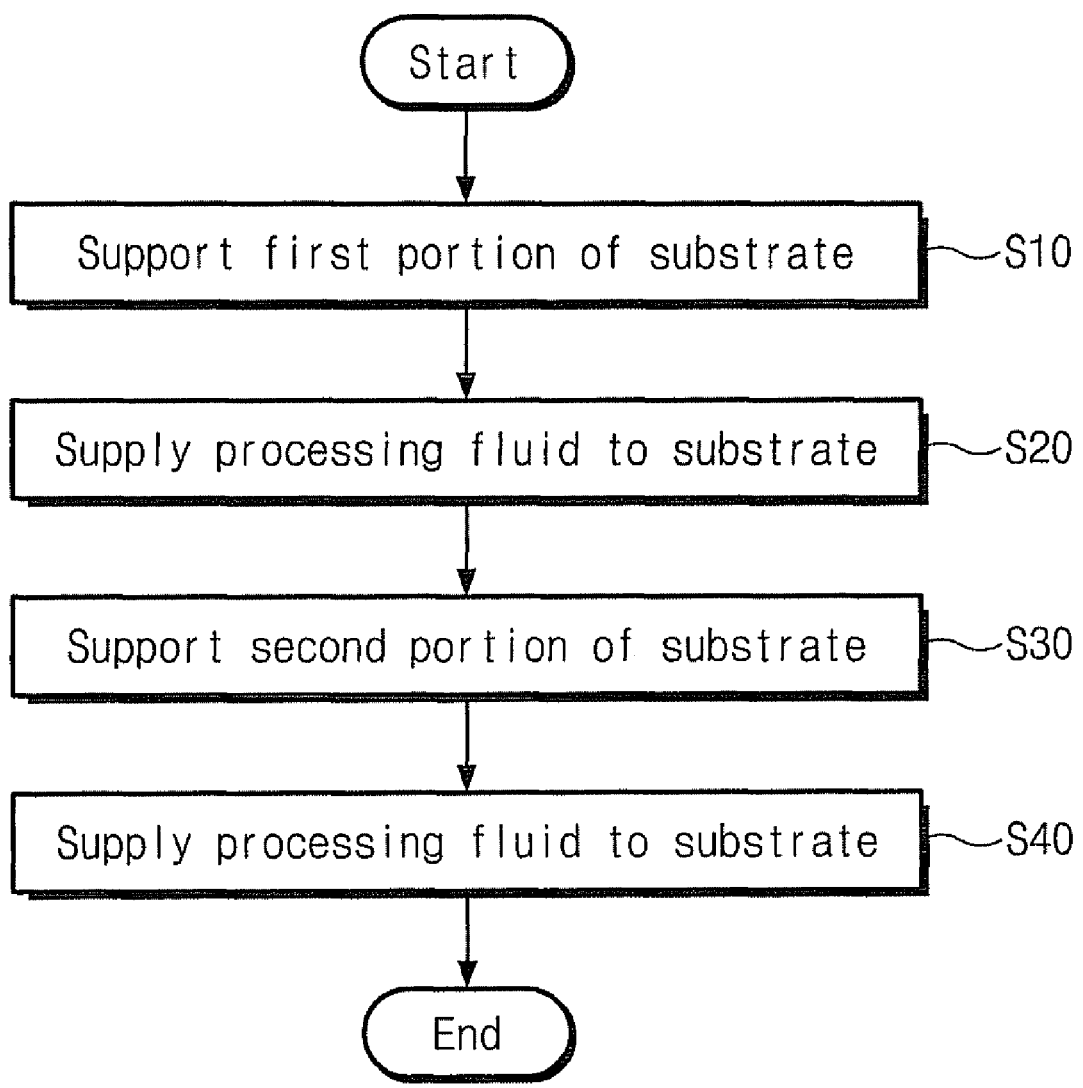
FIG. 6 is a flowchart of a substrate treating method using the sub-treating unit illustrated in FIG. 5.

FIG. 5 is a cross-sectional view of a sub-treating unit illustrated in FIG. 4, and FIG. 6 is a flowchart of a substrate treating method using the sub-treating unit illustrated in FIG. 5. FIG. 5 illustrates any one of first through third sub-treating units 31, 32, and 33. A structure illustrated in FIG. 5 may be applied to all or a portion of the first through third sub-treating units 31, 32, and 33.

Referring to FIG. 5, a chamber 100 having a space in which a wafer W is received is provided. A first support part 110 and a second support part 120 supporting the wafer W are disposed in the chamber 100. Sprayers 130 spraying a processing fluid are disposed in the chamber 100. The first support part 110 can be moved in a first direction D1 and supports a lower end of the wafer W. A pair of second support parts 120 facing each other is provided. The second support parts 120 can be moved in a second direction D2 and support both side ends of the wafer W. The sprayers 130 are spaced from an upper portion of the wafer W. The processing fluid supplied from the sprayers 130 are sprayed onto the wafer W along the first direction D1.

Referring to FIG. 6, in operation S10, a first support part 110 supports a first portion disposed at a lower end of a wafer W that is a semiconductor substrate. In operation S10, second support parts 120 are spaced from the wafer W.

In operation S20, a processing fluid 150 is sprayed through a sprayer 130. The processing fluid 150 may include a processing solution or a processing gas. The processing fluid 150 reacts with the wafer W in an entire region of the wafer W except the first portion.

In operation S30, the second support parts 120 support second portions disposed both side ends of the wafer W. In operation S30, the first support part 110 is spaced from the wafer W.

In operation S40, the processing fluid 150 is provided to react with the wafer W in an entire region of the wafer W except the second portion.

As a result, a process can be uniformly performed on an entire region of the wafer W. In the operations S10, S20, S30, and S40, a support sequence of the first support part 110 and the second support part 120 may be changed. Also, if necessary, an additional support part may be further included in addition to the first and second support parts 110 and 120 so that the wafer W is stably supported.

The operation S20 may be omitted. That is, although the operation S20 is omitted, the processing fluid can be supplied somewhat to the entire region of the wafer W when the processing fluid is supplied through the operation S40. This is done because the second support part 120 supports the wafer W in a perpendicular direction with respect to a direction in which the processing fluid is supplied, and thus, the processing fluid can pass through a space between the second portion and the second support part 120 while the processing fluid is moved in the first direction D1. In case where a corresponding process is a wafer drying process using a gas, a method in which the operation S20 is omitted may be effectively applied. Detailed descriptions with respect to the drying process will be described below.

As described above, the substrate treating method using the substrate treating apparatus illustrated in FIG. 5 was described. However, the substrate treating method of this embodiment can be variously applied to a substrate treating apparatus having a different structure with a plurality of support parts in addition to the substrate treating apparatus illustrated in FIG. 5.

Figure 7:
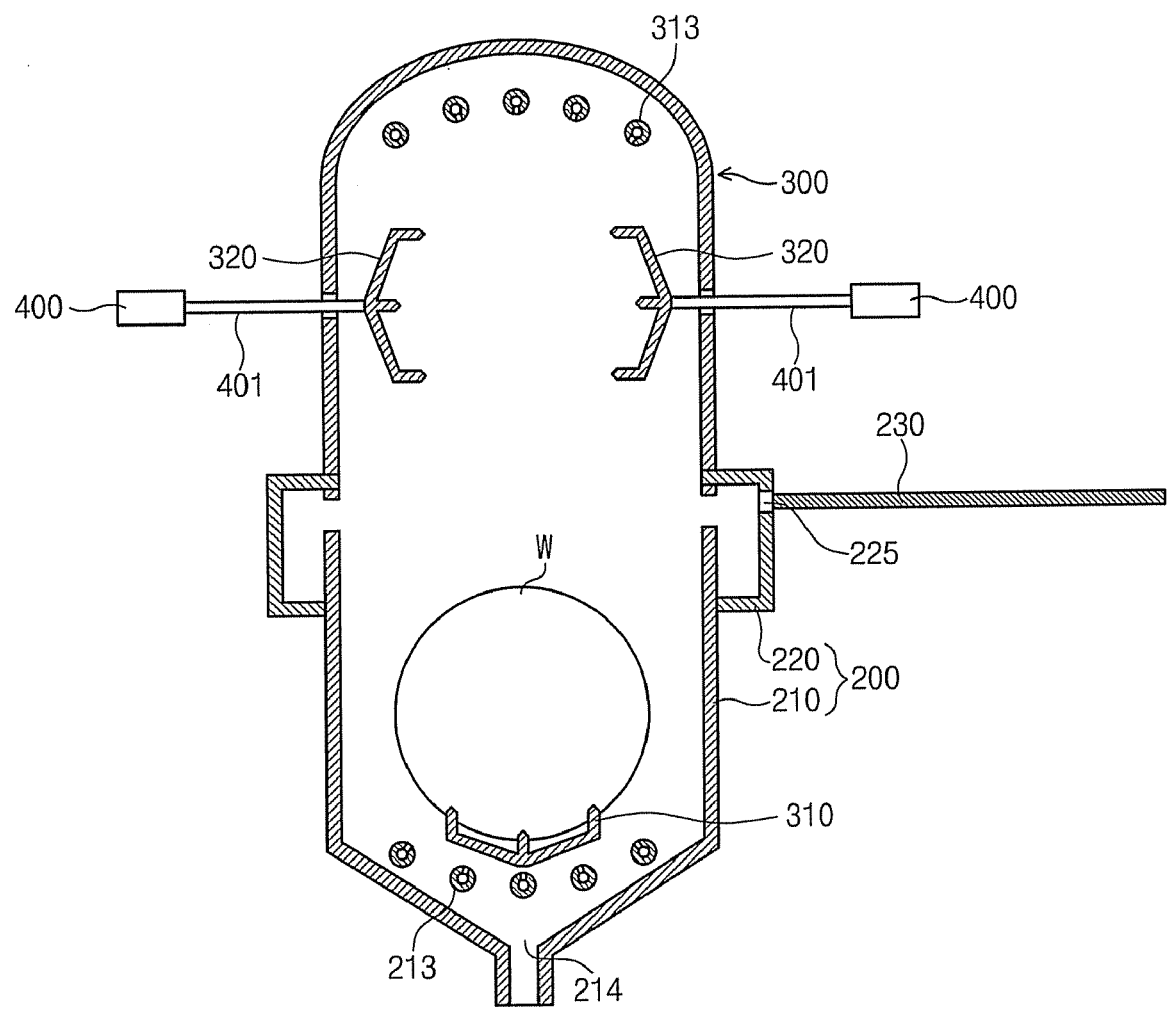
FIG. 7 is a cross-sectional view of the sub-treating unit illustrated in FIG. 4 according to another embodiment of the present invention.

FIG. 7 is a cross-sectional view of the sub-treating unit illustrated in FIG. 4 according to another embodiment of the present invention.

Referring to FIG. 7, two different chambers communicating with each other are provided. For the convenience in description, a chamber disposed in a lower portion in FIG. 7 is called a lower chamber 200, and a chamber disposed in an upper portion is called an upper chamber 300. Different processes are performed in the lower chamber 200 and the upper chamber 300, respectively. For example, a wafer cleaning process may be performed in the lower chamber 200, and a wafer drying process may be performed in the upper chamber 300.

In this case, a first sprayer 213 spraying a cleaning solution is disposed in the lower chamber 200, and a second sprayer 313 spraying a drying gas is disposed in the upper chamber 300. Also, a first support part 310 supporting a lower end of a wafer W is disposed in the lower chamber 200, and second support parts 320 supporting both side ends of the wafer W are disposed in the upper chamber 300. The substrate treating unit described in the preceding embodiment may be used as the first and second support parts 310 and 320.

The lower chamber 200 includes an inner bath 210 and an outer bath 220. The sprayed cleaning solution is filled in the inner bath 210. A drain port 214 discharging the cleaning solution is disposed in a bottom surface of the inner bath 210. The outer bath 220 surrounds the inner bath 210 and receives the cleaning solution overflowing from the inner bath 210. The lower chamber 200 includes a shutter 230 dividing processing regions of the upper chamber 300 and the lower chamber 200. A gate 225 is disposed in a side portion of the lower chamber 200. The shutter comes in and goes out through the gate 225.

The first support part 310 can be vertically moved and transfers the wafer W between the lower chamber 200 and the upper chamber 300. Although not shown in FIG. 7, a transfer unit vertically transferring the first support part 310 may include a motor that is connected to a side of the first support part 310 to transmit a power to a driving shaft passing through an upper portion of the upper chamber 300. A pair of second support parts 320 facing from each other is provided. Driving shafts 401 are connected to the second support ports 320, respectively. A power is transmitted from motors 400 to the driving shafts 401 to allow the second support parts 320 to provide a straight-line motion.

As described above, in case where the upper and lower chambers 300 and 200 are vertically stacked and communicate with each other, the cleaning process is performed on the wafer W, and then, the drying process can be straight performed without requiring the movement of a long distance.

Figure 8:
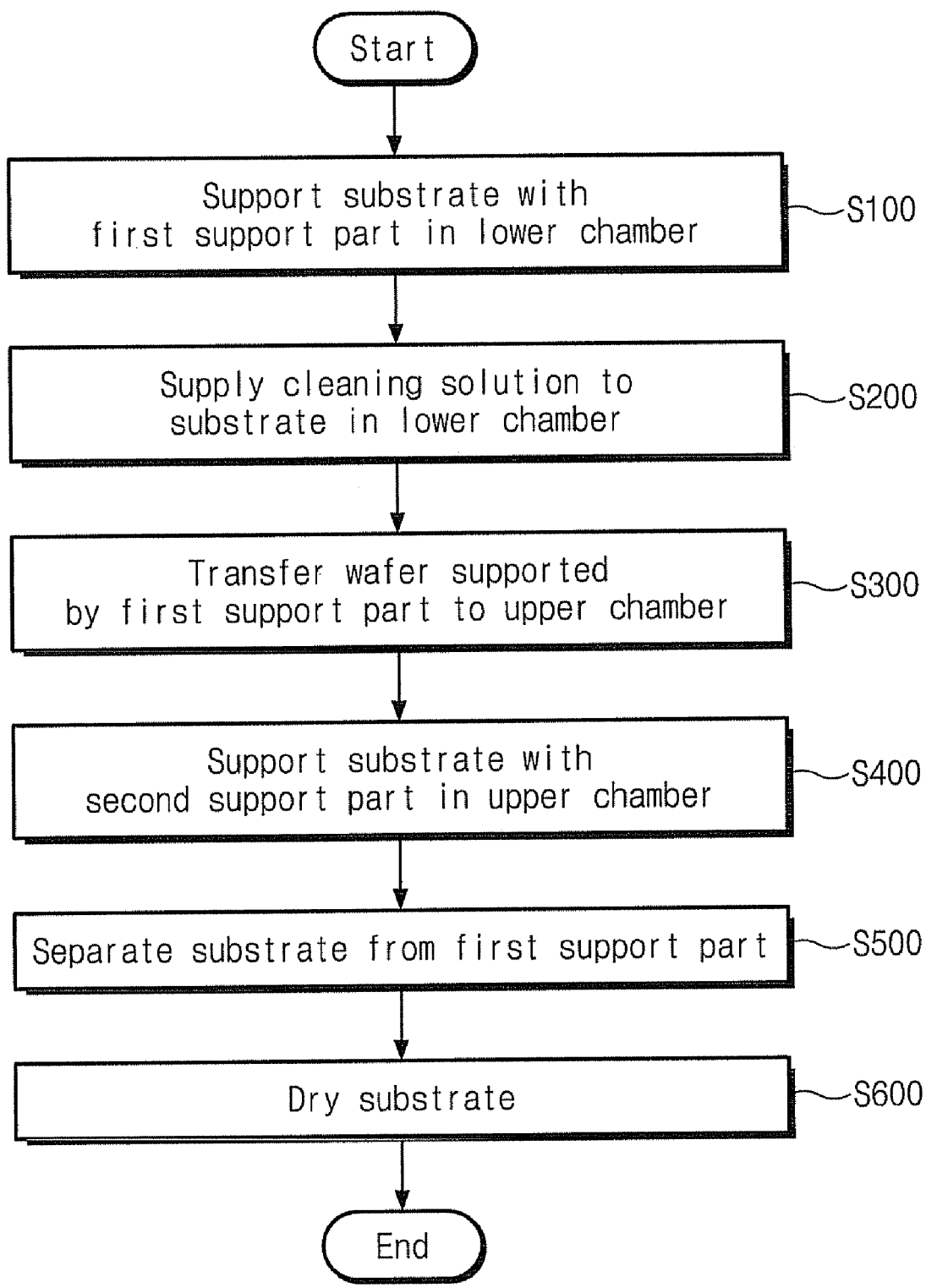
FIG. 8 is a flowchart of a substrate treating method using the sub-treating unit illustrated in FIG. 7.

FIG. 8 is a flowchart of a substrate treating method using the sub-treating unit illustrated in FIG. 7, and FIGS. 9A through 9G are cross-sectional views illustrating an operation process of a substrate treating apparatus corresponding to each of processes illustrated in the flowchart of FIG. 8.

Figure 9A:
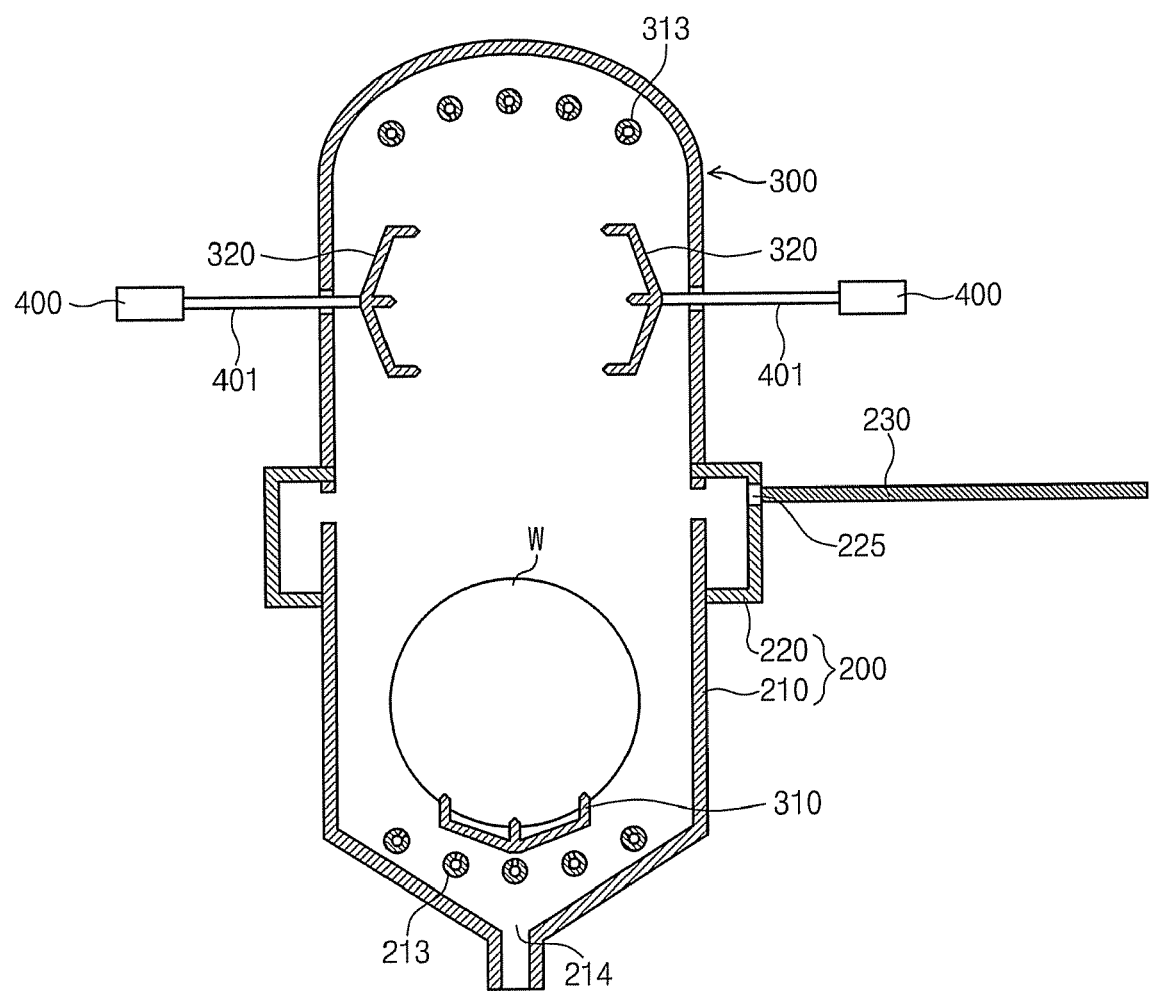
FIGS. 9A through 9G are cross-sectional views illustrating an operation process of a substrate treating apparatus corresponding to each of processes illustrated in the flowchart of FIG. 8.

Referring to FIGS. 8 and 9A, in operation S100, a wafer W is transferred and loaded onto a first support part 310 in a lower chamber 200.

Figure 9B:
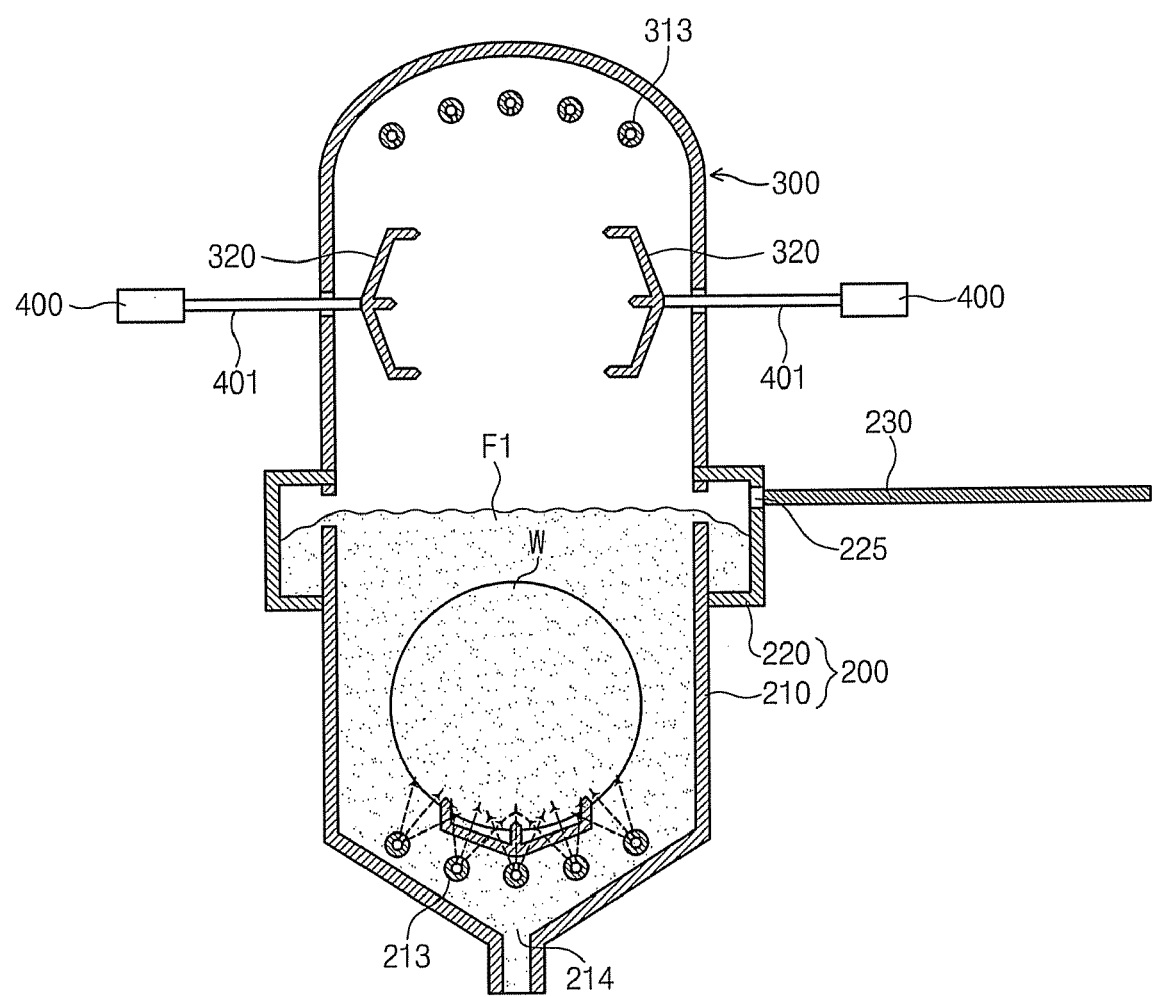

Referring to FIGS. 8 and 9B, in operation S200, a cleaning solution F1 such as pure water is supplied from a first sprayer 213. The cleaning solution F1 fills an inner bath 210 and overflows into an outer bath 220. A wafer W is rinsed while the wafer W is immersed in the cleaning solution F1.

Figure 9C:
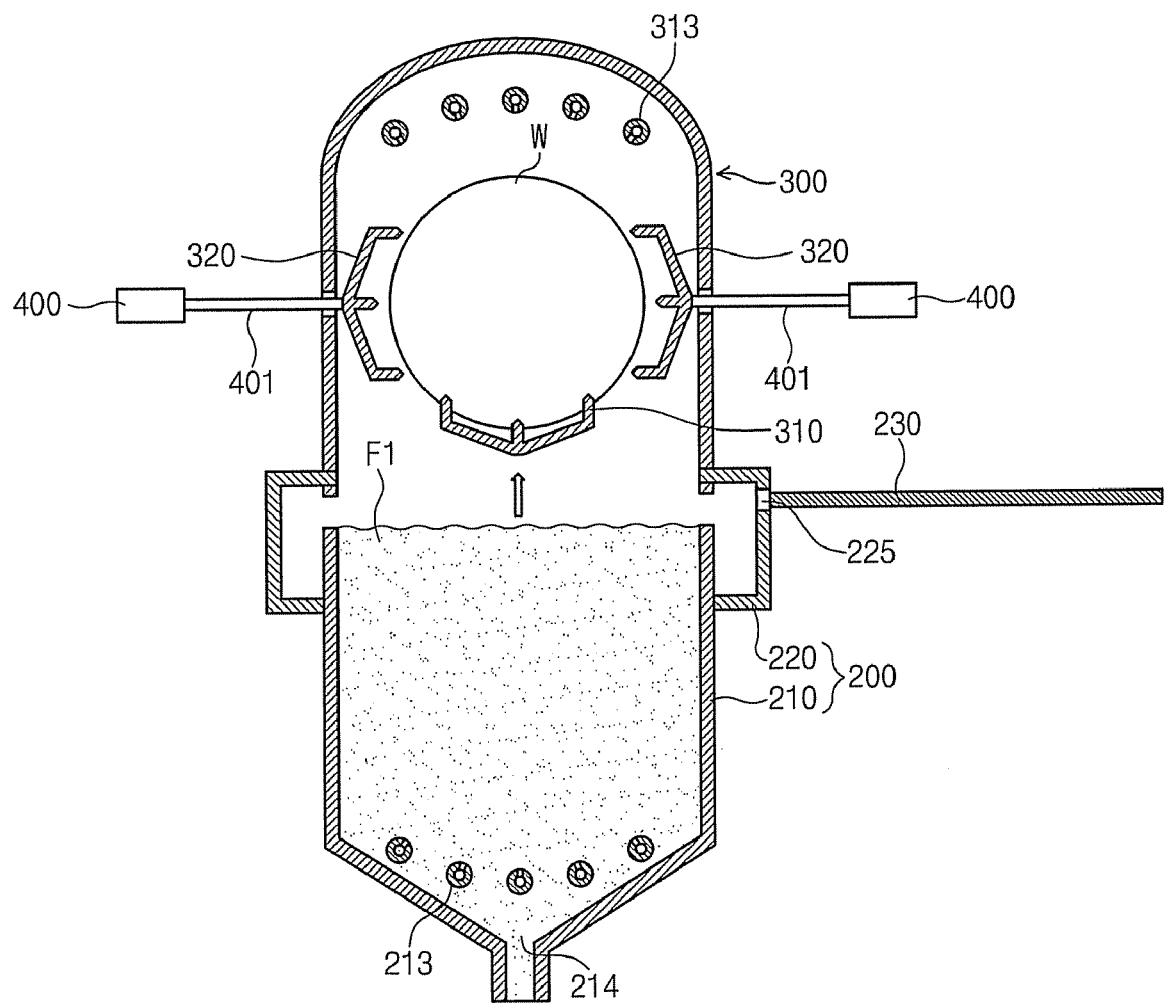

Referring to FIGS. 8 and 9C, in operation S300, the rinsed wafer W is transferred to an upper chamber 300. The wafer W is transferred together with the first support part 310 while the wafer W is supported by the first support part 310.

Figure 9D:
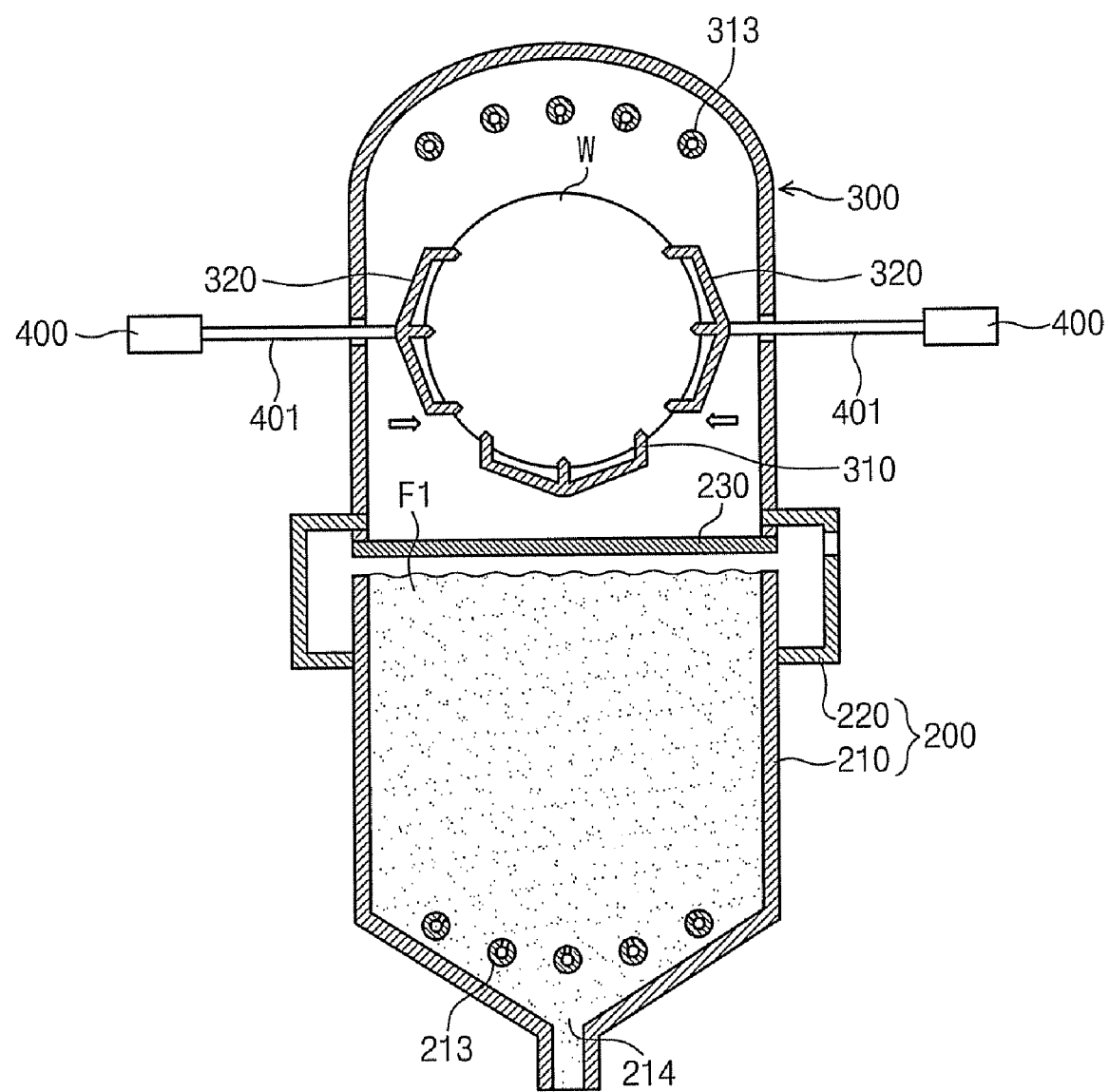

Referring to FIGS. 8 and 9D, in operation S400, a shutter 230 is inserted into a lower chamber 200 to divide a working space between the upper chamber 300 and the lower chamber 200. The second support parts 320 are straightly moved in a horizontal direction to support the wafer W. Although the second support parts 320 are disposed in the upper chamber 300 in FIG. 9D, the present invention is not limited thereto. For example, the second support parts 320 may be disposed outside the upper chamber 300.

That is, the second support parts 320 may be disposed outside the upper chamber 300, and opening-shutting doors through which the second support parts 320 can enter and exit may be disposed in both sides of the upper chamber 300. Under such a structure, the wafer W is transferred from the lower chamber 200 to the upper chamber 300, and then, the opening-shutting doors are opened to allow the second support parts 320 to support the wafer W. In this case, since the second support parts 320 are disposed outside the upper chamber 300, a space within the upper chamber 300 can be reduced by a space occupied by the second support parts 320.

Figure 9E:
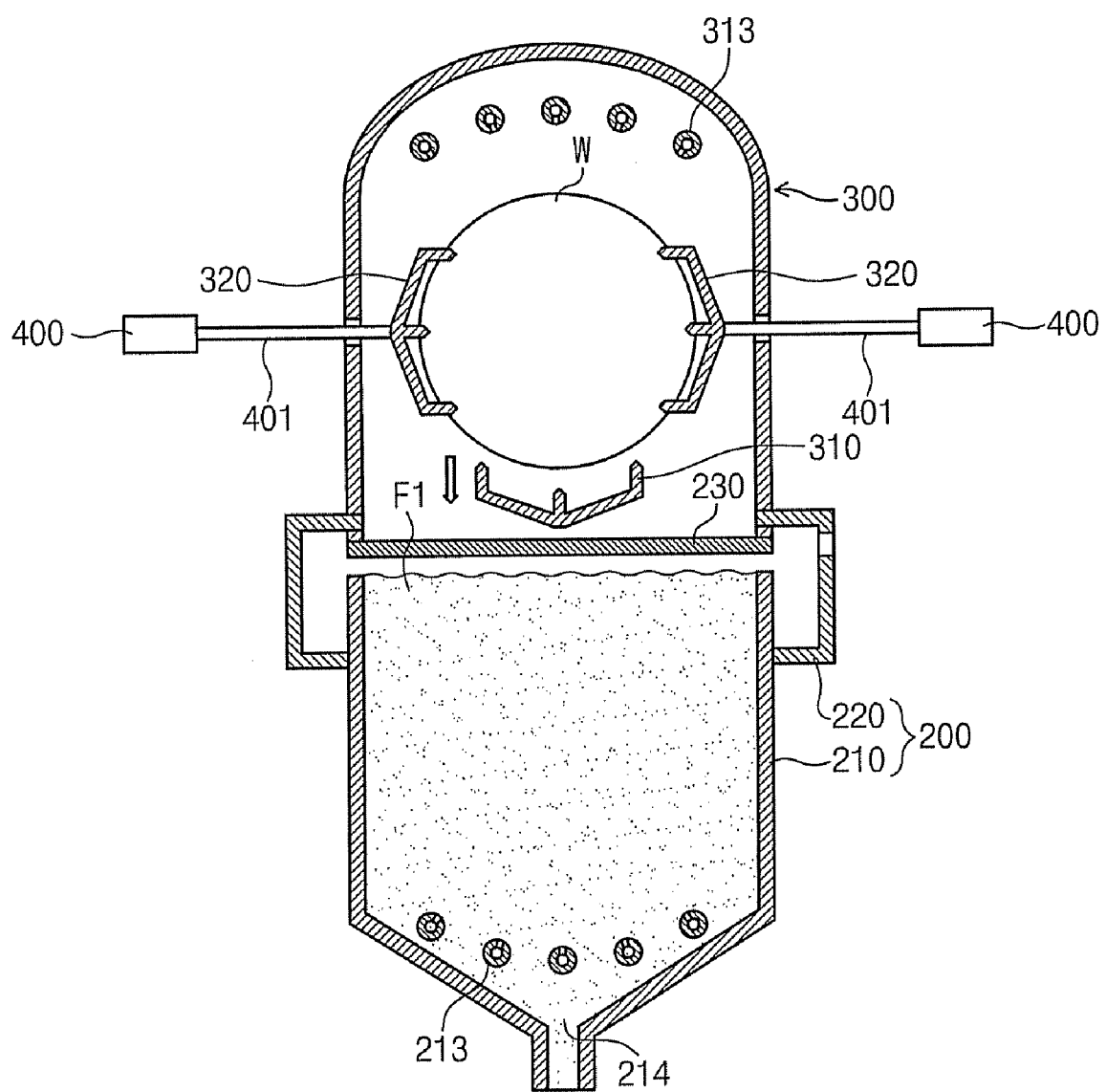

Referring to FIGS. 8 and 9E, in operation S500, the first support part 310 is moved downwardly and spaced from the wafer W. As a result, the wafer W is supported by only the second support parts 320.

Figure 9F:
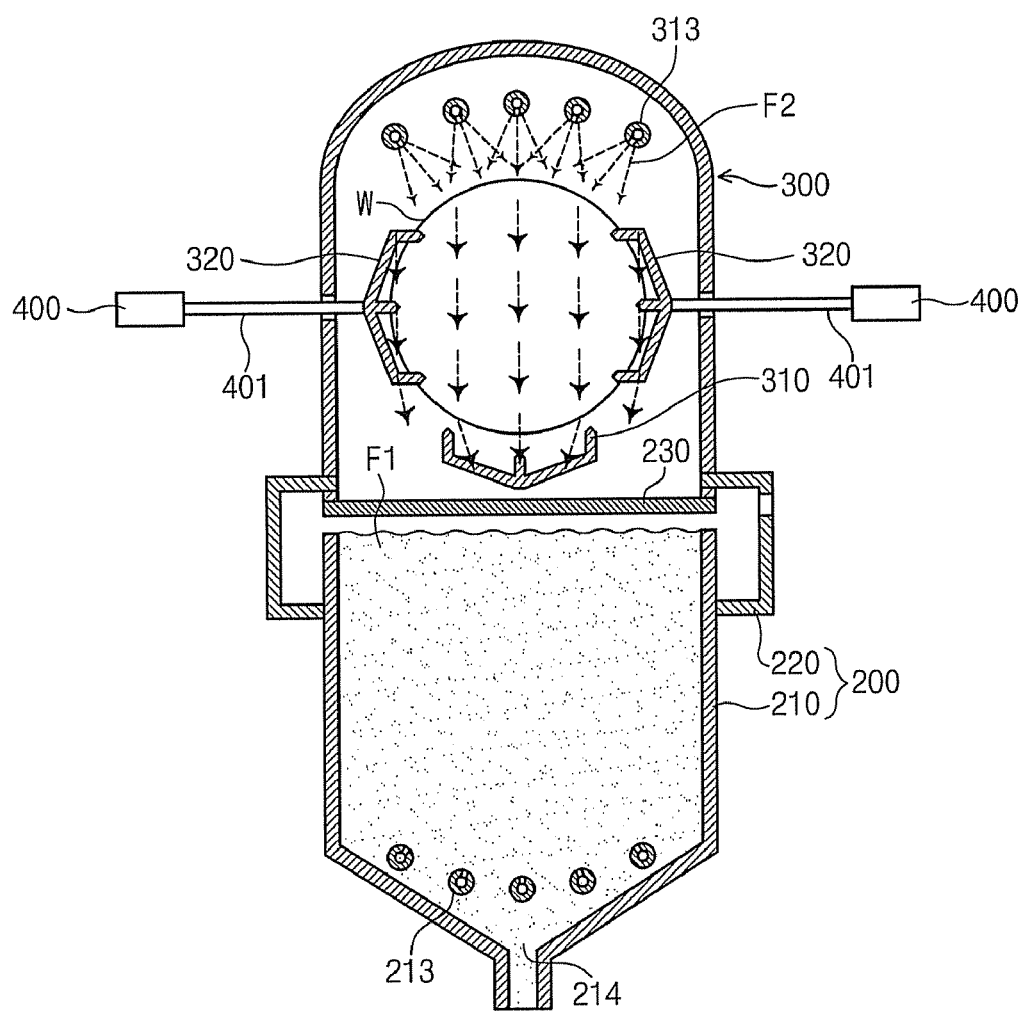

Referring to FIGS. 8 and 9F, in operation S600, a drying gas F2 is sprayed from a second sprayer 313, and the sprayed drying gas is supplied to the wafer W. $C_3H_8O$ and $N_2$ may be used as the drying gas F2. Although not shown in FIG. 9F, a plurality of discharge holes may be disposed in the shutter 230. In this case, the drying gas F2 is transferred into the lower chamber 200 through the discharge holes, and the drying gas F2 transferred into the lower chamber 200 is discharged to the outside.

Figure 9G:
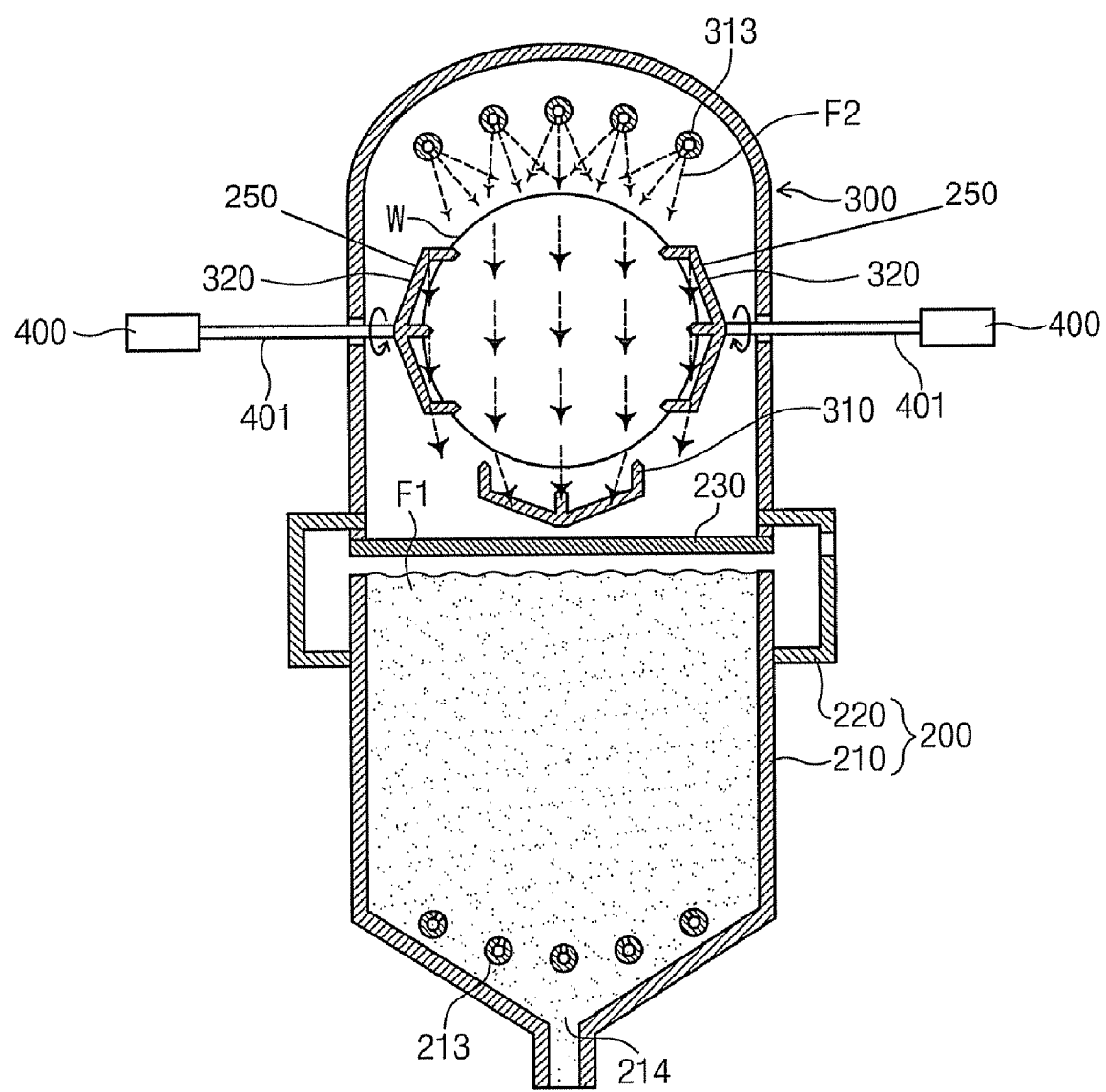

As illustrated in FIG. 9G, a second support 250 may rotate while the drying gas F2 is supplied from the second sprayer 313 in the operation S600.

That is, while the drying gas F2 is supplied, the second support 250 selectively receives a power from driving shafts 400. Thus, the second support parts 320 may rotate. When the second support 250 rotates, the wafer W supported by the second support parts 320 rotates together with the second support parts 320. During the rotation of the wafer W, the cleaning solution F1 flows downwardly over an entire region of the wafer W. Also, the drying gas F2 is uniformly provided over the entire region of the wafer W due to the rotation of the wafer W.

If the second support parts are not installed, and the drying gas F2 is supplied while the wafer W is supported by the first support part 310, the cleaning solution F1 pooling and remaining on the first support part 310 is suddenly dried by the drying gas F2 to generate watermarks on a portion at which the wafer W is supported by the first support part 310, thereby causing impurity particles.

However, as described in this embodiment, if the wafer W is supported by the second support parts 320, the cleaning solution F1 pooling on the portion at which the wafer W is supported by the first support part 310 flows downwardly. In this condition, if the drying gas F2 is supplied, the entire region of the wafer W can be uniformly dried to prevent the watermarks from being generated.

As described above, according to the embodiments, the process is uniformly performed over the entire region of the wafer W to improve a processing efficiency. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate support unit, comprising:
   a first support part movable in a vertical direction, the first support part supporting lower ends of a plurality of substrates that are vertically disposed; and
   second support parts movable in a horizontal direction via movable shafts, the second support parts supporting opposing sides of the plurality of substrates in at least three positions, a first position located proximate a center edge of the opposing sides, a second position located above the center edge of the opposing sides, and a third position located below the center edge of the opposing sides;
   wherein the second support parts and the plurality of substrates are rotatable together about the movable shafts.

2. The substrate support unit of claim 1, wherein the first support part and the second support parts support the substrate at different times while a process with respect to the substrate is progressed.

3. The substrate support unit of claim 1, wherein each of the first and second support parts comprises:
   a base plate; and
   three support members disposed on the base plate, the support members including slots in which the substrate is inserted.

4. A substrate treating apparatus, comprising:
   a first chamber receiving a substrate, the first chamber performing a process with respect to the substrate;
   a sprayer in the first chamber, the sprayer supplying a processing fluid to the substrate; and a substrate support unit in the first chamber, the substrate support unit supporting the substrate while the process is progressed,
   wherein the substrate support unit comprises:
      a first support part for supporting a lower end of the substrate that is vertically disposed, and the first support part being movable in a vertical direction; and
      a second support for supporting opposing sides of the substrate in at least three positions, a first position located proximate a center edge of the opposing sides, a second position located above the center edge of the opposing sides, and a third position located below the center edge of the opposing sides, the second support part being movable in a horizontal direction, and the second support part comprising a shaft for moving the second support part in the horizontal direction;

wherein at least one of the first support part and the second support part supports the substrate while the processing fluid is supplied; and wherein a portion of the second support part and the substrate are rotatable together about the shaft.

5. The substrate treating apparatus of claim 4, wherein the first support part and the second support part support the substrate at different times while a process with respect to the substrate is progressed.

6. The substrate treating apparatus of claim 4, wherein each of the first and second support parts comprises:

a base plate; and three support members disposed on the base plate, the support members including slots in which the substrate is inserted.

7. The substrate treating apparatus of claim 4, comprising a pair of second support parts facing each other across the substrate is provided.

8. The substrate treating apparatus of claim 7, wherein the first direction is perpendicular to the second direction.

9. The substrate treating apparatus of claim 4, further comprising a second chamber under the first chamber.

10. The substrate treating apparatus of claim 9, further comprising:

a first sprayer in the first chamber, the first sprayer supplying a cleaning fluid; and a second sprayer in the second chamber, the second sprayer supplying a drying gas.

* * * * *